United States Patent
Zimmerman et al.

(10) Patent No.: US 7,277,295 B2
(45) Date of Patent: Oct. 2, 2007

(54) INDUSTRIAL ETHERNET SWITCH

(75) Inventors: Craig A. Zimmerman, Austin, TX (US); Earl W. Boone, Round Rock, TX (US); Matthew D. Grimm, Marble Falls, TX (US); William C Johnson, Austin, TX (US); Daniel Nix, Ennis, TX (US)

(73) Assignee: Cisco Technology, Inc., San Jose, CA (US)

( * ) Notice: Subject to any disclaimer, the term of this patent is extended or adjusted under 35 U.S.C. 154(b) by 391 days.

(21) Appl. No.: 10/377,189

(22) Filed: Feb. 28, 2003

(65) Prior Publication Data

US 2004/0170004 A1    Sep. 2, 2004

(51) Int. Cl.
*H05K 5/00* (2006.01)
*H05K 7/14* (2006.01)
*F21V 7/04* (2006.01)
*B64D 47/06* (2006.01)
*A41F 1/00* (2006.01)

(52) U.S. Cl. ................ 361/752; 361/696; 361/700; 361/703; 361/796; 362/551; 362/559; 362/581

(58) Field of Classification Search ............... 361/752, 361/679, 600, 700, 709, 796, 189, 703, 789; 362/551, 559, 581
See application file for complete search history.

(56) References Cited

U.S. PATENT DOCUMENTS 3,696,210 A    10/1972    Peterson et al.

(Continued)

FOREIGN PATENT DOCUMENTS

GB    2310086    8/1997

(Continued)

OTHER PUBLICATIONS

PCT Invitation to Pay Additional Fees (PCT Article 17(3)(a) and Rule 40.1); mailed Aug. 23, 2004 Re: PCT/US2004/005823; filed Feb. 24, 2004 (6 pgs.).

(Continued)

*Primary Examiner*—Tuan T. Dinh
*Assistant Examiner*—Ivan Carpio
(74) *Attorney, Agent, or Firm*—Baker Botts L.L.P.

(57) ABSTRACT

According to one embodiment of the invention, an apparatus includes a housing having a front side and a bottom side adjacent the front side. The apparatus also includes a plurality of light generating devices each operable to generate light in response to operation of a particular component of the apparatus. The apparatus also includes a plurality of light pipes each associated with a respective ones of the light generating devices and operable to display light generated by the respective light generating device such that the light is visible on the front side and on the bottom side of the housing.

According to another embodiment, an apparatus includes a housing having at least one heat sink disposed therein and overlying a component of the apparatus. The apparatus also includes at least one heat sink having a base and a plurality of fins extending from the base. The apparatus also includes an elastic clip having a middle portion placing an elastic force on the base in order to couple the heat sink to the component and two end portions securing the clip in place.

23 Claims, 11 Drawing Sheets

U.S. PATENT DOCUMENTS

| | | | |
|---|---|---|---|
| 4,045,624 A | 8/1977 | Browne | |
| 4,388,715 A | 6/1983 | Renaudin et al. | |
| 4,660,194 A | 4/1987 | Larson et al. | |
| 5,615,224 A | 3/1997 | Cohen | 372/36 |
| 5,651,260 A | 7/1997 | Goto et al. | 62/126 |
| 5,714,938 A | 2/1998 | Schwabl | |
| 5,764,482 A * | 6/1998 | Meyer et al. | 361/699 |
| 5,771,274 A | 6/1998 | Harris | |
| 5,793,922 A | 8/1998 | Kim | |
| 5,825,618 A * | 10/1998 | Schnoor et al. | 361/686 |
| 5,898,557 A | 4/1999 | Baba et al. | |
| 5,920,264 A | 7/1999 | Kim et al. | 340/583 |
| 5,973,922 A * | 10/1999 | Kamphuis | 361/704 |
| 6,005,700 A * | 12/1999 | Pressler et al. | 398/117 |
| 6,175,501 B1 | 1/2001 | Bortolini et al. | 361/720 |
| 6,381,214 B1 * | 4/2002 | Prasad | 370/230.1 |
| 6,411,506 B1 | 6/2002 | Hipp et al. | |
| 6,452,809 B1 * | 9/2002 | Jackson et al. | 361/796 |
| 6,496,118 B1 | 12/2002 | Smith | 340/584 |
| 6,549,689 B2 | 4/2003 | Furuichi et al. | |
| 6,632,008 B2 * | 10/2003 | Kalkbrenner | 362/554 |
| 6,633,998 B1 | 10/2003 | Lau | |
| 6,636,478 B1 | 10/2003 | Sensel et al. | |
| 6,636,499 B1 | 10/2003 | Dowling | 370/338 |
| 6,644,395 B1 * | 11/2003 | Bergin | 165/185 |
| 6,661,772 B2 | 12/2003 | Matsuno et al. | |
| 6,724,635 B2 | 4/2004 | Larson et al. | 361/736 |
| 6,754,085 B2 * | 6/2004 | Kalkbrenner | 361/752 |
| 6,780,047 B1 * | 8/2004 | Laity et al. | 439/501 |
| 6,798,744 B1 * | 9/2004 | Loewen et al. | 370/235 |
| 6,808,289 B2 * | 10/2004 | Reed | 362/198 |
| 6,835,453 B2 * | 12/2004 | Greenwood et al. | 428/343 |
| 6,853,316 B2 | 2/2005 | Payson et al. | 340/999 |
| 2002/0025710 A1 | 2/2002 | Payson et al. | 439/320 |
| 2002/0104030 A1 | 8/2002 | Ahn | 713/310 |
| 2002/0124114 A1 | 9/2002 | Bottom et al. | 709/251 |
| 2002/0135601 A1 | 9/2002 | Watanabe et al. | |
| 2002/0194412 A1 | 12/2002 | Bottom et al. | 710/302 |
| 2003/0081604 A1 | 5/2003 | Danner et al. | 370/392 |
| 2003/0081620 A1 | 5/2003 | Danner et al. | 370/400 |
| 2003/0123453 A1 | 7/2003 | Ooghe et al. | 370/395.53 |
| 2003/0135601 A1 | 7/2003 | Pozzuoli | 709/223 |
| 2003/0163561 A1 | 8/2003 | Lee et al. | 709/224 |
| 2004/0095720 A1 | 5/2004 | Elo et al. | 361/690 |
| 2004/0179470 A1 | 9/2004 | Nguyen et al. | 370/216 |

FOREIGN PATENT DOCUMENTS

| | | |
|---|---|---|
| WO | WO 02/17039 A2 | 2/2002 |
| WO | WO 02/23676 A1 | 3/2002 |

OTHER PUBLICATIONS

U.S. Appl. No. 10/377,066, filed Feb. 28, 2003, entitled "Ethernet Switch With Configurable Alarms", 37 pages of text and 10 pages of drawings.

U.S. Appl. No. 10/377,570, filed Feb. 28, 2003, entitled "Industrial Ethernet Switch", 39 pages of text and 10 pages of drawings.

* cited by examiner

INDUSTRIAL ETHERNET SWITCH

TECHNICAL FIELD OF THE INVENTION

This invention relates generally to communications and more particularly to an industrial Ethernet switch.

BACKGROUND OF THE INVENTION

Ethernet is a standard for communicating both data and voice signals. The use of Ethernet communications in industrial applications is increasing, and in response, Ethernet switches particularly designed for industrial applications are being produced. In contrast to many conventional Ethernet applications, in industrial applications it is often desired to locate an Ethernet switch in two different orientations. The use of the same Ethernet switch in different orientations presents problems.

Due to the unclean environments in which industrial Ethernet switches are often used, standards dictate that only passive cooling techniques may be implemented. Thus, cooling fans are not permitted. Therefore cooling an industrial Ethernet switch to a sufficient degree is a challenge facing industrial Ethernet switch designers.

SUMMARY OF THE INVENTION

According to one embodiment of the invention, an apparatus includes a housing having a front side and a bottom side adjacent the front side. The apparatus also includes a plurality of light generating devices each operable to generate light in response to operation of a particular component of the apparatus. The apparatus also includes a plurality of light pipes each associated with a respective one of the light generating devices and operable to display light generated by the respective light generating device such that the light is visible on the front side and on the bottom side of the housing.

According to another embodiment, an apparatus includes a housing having at least one heat sink disposed therein and overlying a component of the apparatus. The apparatus also includes at least one heat sink having a base and a plurality of fins extending from the base. The apparatus also includes an elastic clip having a middle portion placing an elastic force on the base in order to couple the heat sink to the component and two end portions securing the clip in place.

Embodiments of the invention may provide numerous advantages. Some embodiments may include some, none, or all of the below described advantages. For example, in one embodiment of the invention, an Ethernet switch is provided that allows a user to view an indication of the status of the operation of the switch from more than one position. This allows configuration during installation of the device to one of several possible orientations, which is often desired in certain uses of Ethernet switches. According to one embodiment, such an indication may be provided in a relatively inexpensive manner.

According to another embodiment of the invention, good thermal contact between a heat sink and a component to be cooled is maintained by applying an elastic force to the heat sink by an elastic clip. In a particular embodiment such an elastic force enables by constant pressure between the heat sink and the component to be cooled even through a phase change of an associated phase change material.

Other advantages are readily apparent to one skilled in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS OF THE INVENTION

Embodiments of the invention are best understood by referring to FIGS. 1A through 5B of the drawings, like numerals being used for like and corresponding parts of the various drawings.

Figure 1A:
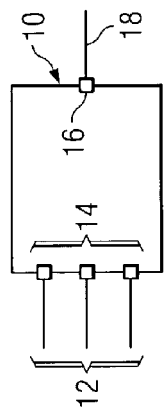
FIG. 1A is a block diagram illustrating an Ethernet switch according to the teachings of the invention.

FIG. 1A is a block diagram illustrating an Ethernet switch 10 according to the teachings of the invention. Ethernet switch 10 receives a plurality of lines 12 at respective ports 14. Ethernet switch 10 may selectively couple, or switch, each line 12 to another line 12 or to an uplink 18 through output ports 16. Ethernet switches may be used in a variety of contexts to communicate voice and data to a desired location and may be located in a variety of locations, such as within a central office of a telecommunications carrier or within a manufacturing or industrial environment.

In manufacturing or industrial environments, space limitations differ from those of many central offices of a telecommunications carrier. In particular, in industrial and manufacturing applications Ethernet switch 10 may be oriented in a variety of fashions and thus it is not known which side of Ethernet switch 10 would be visible to a user. In contrast, because of the conventional layout of many central offices, it is well known which side of the Ethernet device would be visible to the particular user. The teachings of the invention recognize this and provide indications of the status of operation of Ethernet switch that are visible on more than just one side, allowing orientation of the Ethernet device according to the desires of the user. Additional details are described in conjunction with FIGS. 1B through 2C.

Figure 1B:
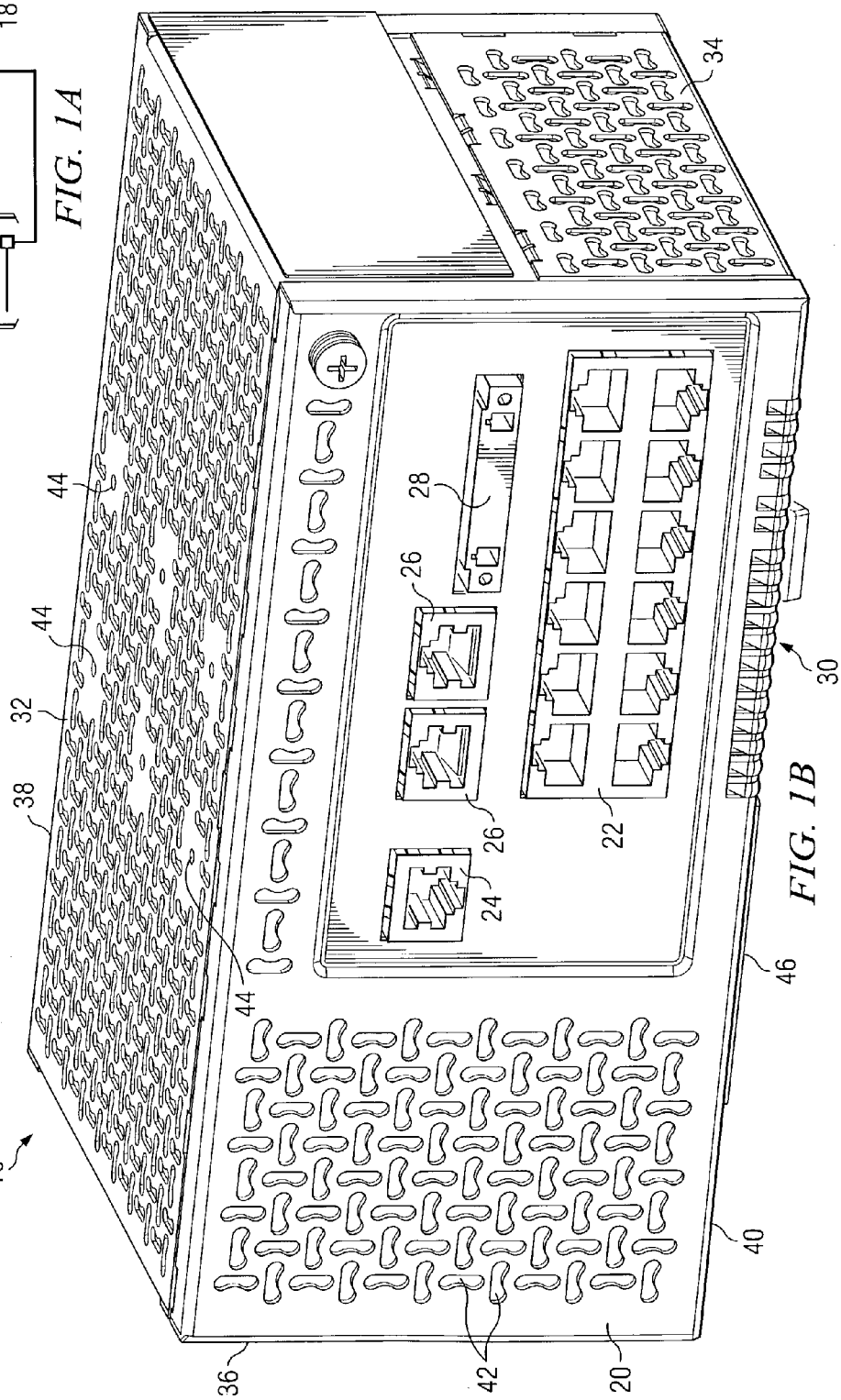
FIG. 1B is a schematic diagram illustrating a front view of the Ethernet switch of FIG. 1A.

FIG. 1B illustrates an isometric drawing of Ethernet switch 10 according to the teachings of the invention. In this view the front 20 of Ethernet switch is illustrated. Shown on front 20 of Ethernet switch 10 are a plurality of RJ connectors, or ports, 22, a console port 24, two uplink ports 26, a power connector 28, and a plurality of light pipes 30. Ethernet switch 10 also has a top side 32, a right side 34, a left side 36, a back side 38, and a bottom side 40. An edge 46 is formed by front side 20 and bottom side 40.

Formed on the various sides of Ethernet switch 10 are a plurality of apertures 42 for allowing cooling of Ethernet switch 10. Formed on top side 38 are a plurality of mounting holes 44 for mounting a mounting clip (not explicitly shown in FIG. 1B) for facilitating mounting of Ethernet switch 10 to DIN rails during installation in an industrial environment.

RJ ports 22 correspond to ports 14 of FIG. 1A. RJ ports 22 may each accept a RJ compatible line carrying voice or data traffic. Console port 24 allows connection to a console for controlling Ethernet switch 10. Link ports 26 provide a connection to another device, such as a router, connected to Ethernet switch 10. Connector 28 provides a location for providing power to Ethernet switch 10 as well as providing a location for user access to the relay connections.

Figure 1C:
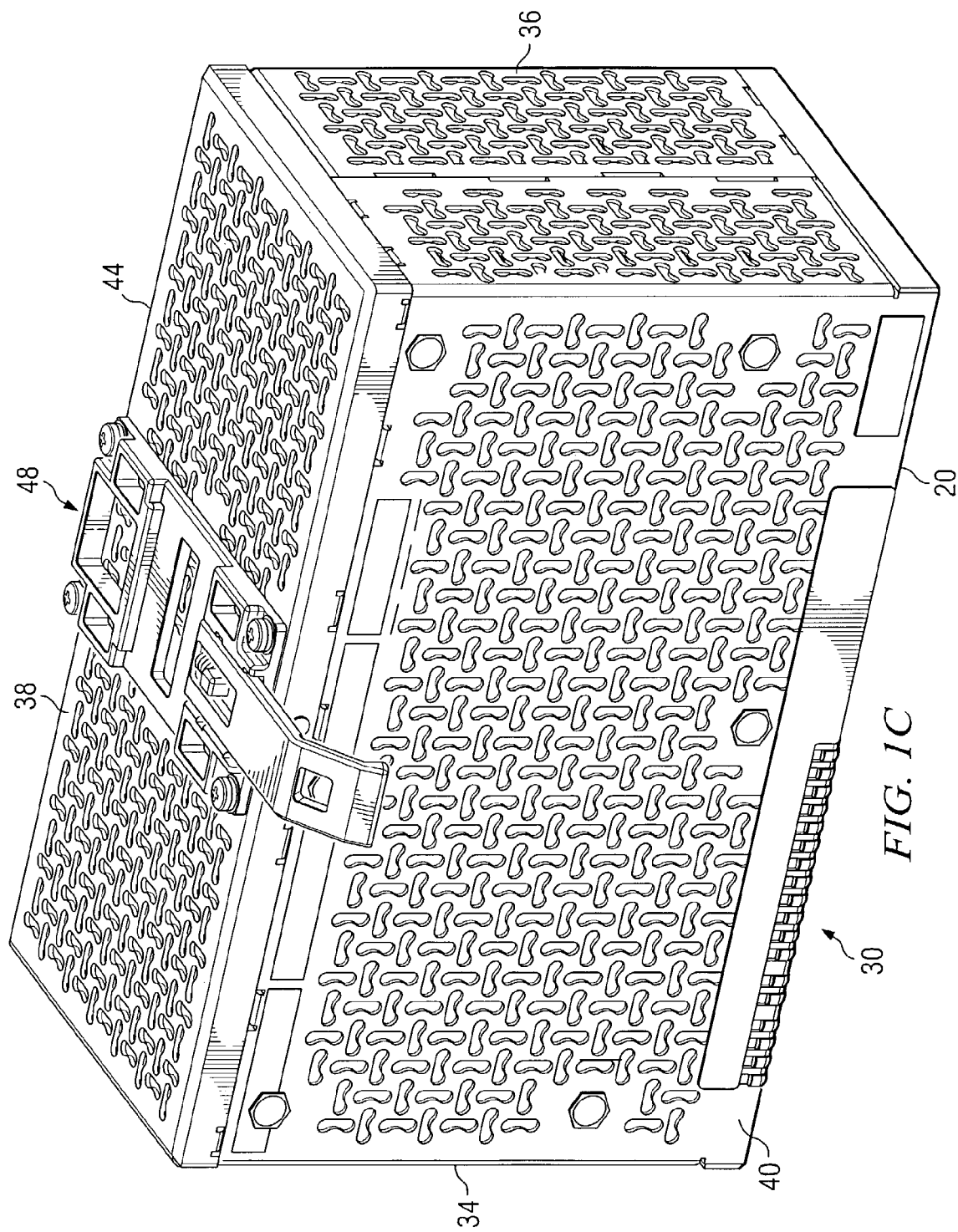
FIG. 1C is a schematic diagram illustrating a bottom view of the Ethernet switch of FIG. 1A.

Light pipes 30 provide an indication of the operation of Ethernet switch 10. According to the teachings of one embodiment of the invention, light pipes 30 are provided such that they are visible both when Ethernet switch 10 rests on bottom side 40 as well as when it rests on front side 20 (as shown in FIG. 1C). Thus, when Ethernet switch 10 is installed to rest either on its front side 20 or its bottom side 40, an indication of the operation of Ethernet switch 10 may be provided in either configuration. Additional details of light pipes 30 are provided below in conjunction with FIGS. 1C through 2D.

FIG. 1C is an isometric drawing of Ethernet switch 10 shown in an alternative orientation. In this orientation, Ethernet switch 10 rests on front side 20. Note that in this configuration, the left and right sides are reversed, as compared to FIG. 1B. Thus, left side 36 is visible in this view. This configuration represents a second installation orientation of Ethernet device 10 with the other likely installation orientation shown in FIG. 1B. Also illustrated in this view is a mounting clip 48, which may be utilized to mount Ethernet switch 10 to DIN rails A plurality of mounting apertures, such as mounting apertures 44, are also formed in back side 38, but are obscured from view by mounting clip 48.

Figure 2A:
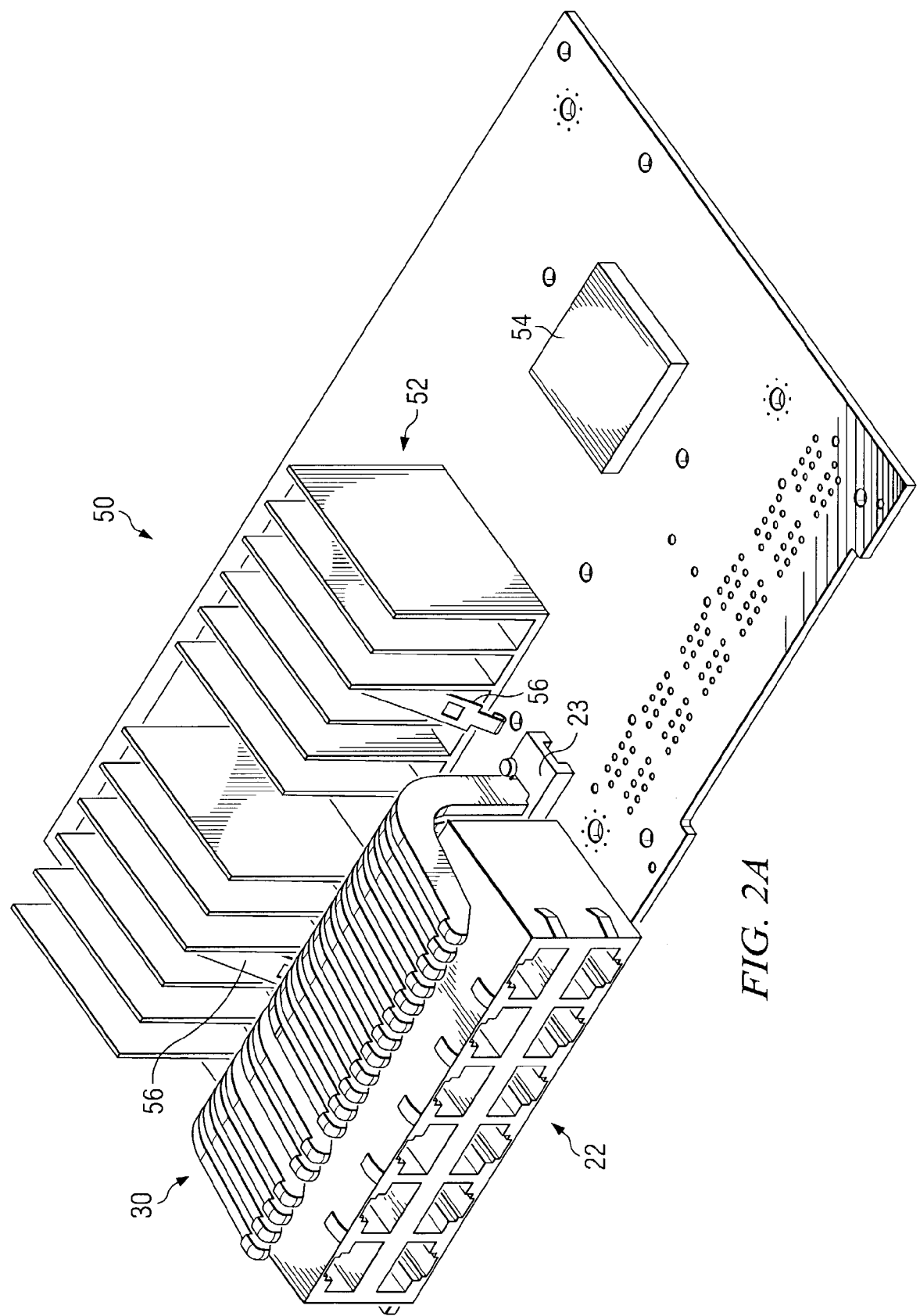
FIG. 2A is an isometric drawing of portion of the interior of the Ethernet switch of FIGS. 1A through 1C showing more clearly port connectors and light pipes of the Ethernet switch.

FIG. 2A is an isometric drawing of portions of the interior of Ethernet switch 10 according to the teachings of the invention. Shown is a PHY card 50, which has attached thereto ports 22, light pipes 30, heat sinks 52, and a physical device chip 54. Heat sinks 52 help cool Ethernet switch 10 as warm air flows across the surface of heat sinks 52, as described in greater detail below. Physical device chip 54 provides necessary functionality for receiving and transmitting signals through ports 22. A clip 56 is provided to secure heat sinks 52 to PHY card 50, and is described in greater detail below. Underneath light pipes 30 are a plurality of light emitting diodes 23 that are indicative of the operating state of particular one of ports 22 or other portions of Ethernet switch 10. Conventionally, light generated by such LEDs could only be viewed from one side of an Ethernet switch.

Figure 2B:
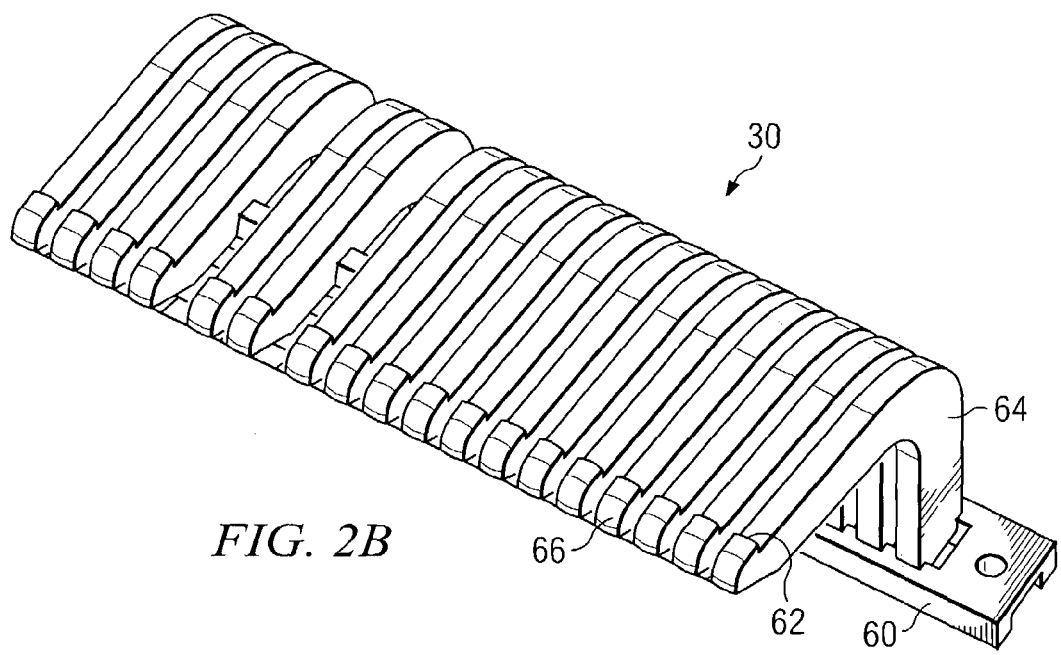
FIG. 2B is an isometric drawing illustrating in more detail the light pipes shown in FIG. 2A.
Figure 2C:
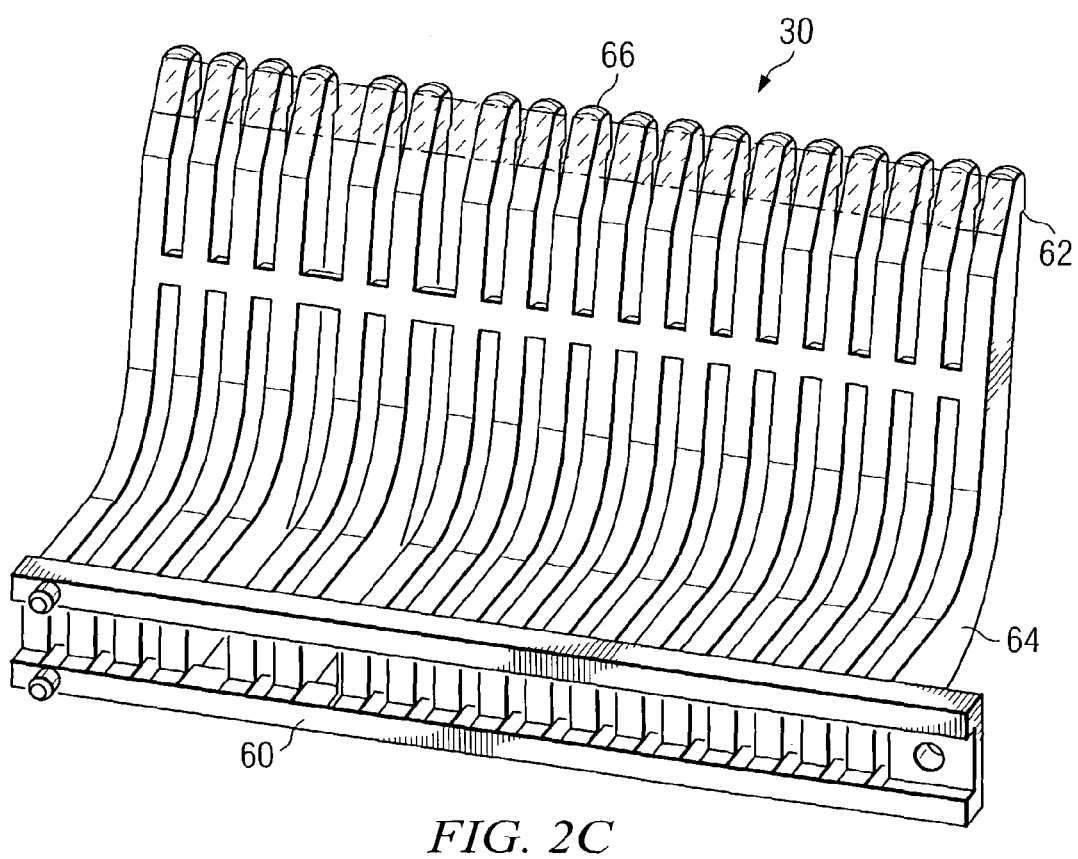
FIG. 2C is an isometric drawing showing a bottom view of the light pipes of FIG. 2B.

FIG. 2B illustrates light pipes 30 in greater detail. Light pipes 30 are connected to a base 60 and are formed with an end portion 62 and a base portion 64. On end portion 62 is a light emitting region 66 through which light passes to provide an indication of the operation of Ethernet switch 10. In particular, in one embodiment base portion 64 overlies light emitting diodes 23 (not explicitly shown) that are indicative of the operation of each of ports 22, or alternatively, indicative of the operation of other functions of Ethernet switch 10, including ports 26, power connector 28, and other operations of Ethernet switch 10. FIG. 2C illustrates a reverse view of light pipes 30.

Figure 2D:
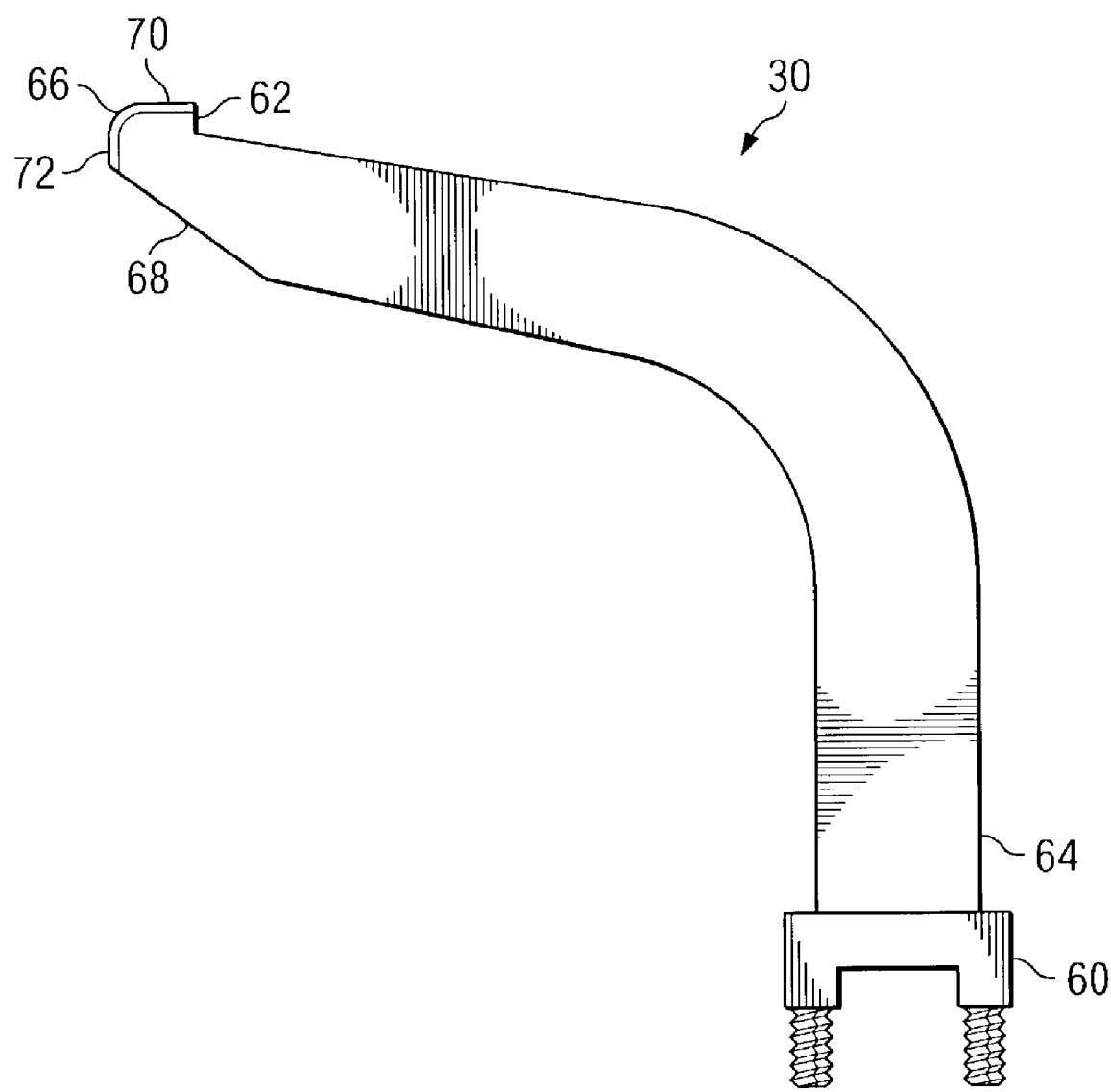
FIG. 2D is a side view of one of the light pipes of FIGS. 2C and 2D showing additional details of the light pipe.

FIG. 2D is a side view a single light pipe 30. Illustrated in FIG. 2D is an inclined portion 68. Inclined portion 68 reflects light incident upon it towards light emitting regions 66. In particular, light is reflected onto horizontal portion 70 of light emitting region 66. Light reflected by portions of light pipe 30 may travel through portion 72 of light emitting region 66 without significant reflection from inclined portion 68. Thus inclined portion 68 is provided such that light may emit from light emitting region 66 in generally different directions, thus allowing viewing of light indicative of the operation of Ethernet switch 10 on both the front 20 of Ethernet switch 10 (as illustrated in FIG. 1B) and the bottom 40 of Ethernet switch 10 (as illustrated in FIG. 1C).

Although a variety of materials may be utilized for light pipes 30, in one embodiment, light pipe 30 is formed from GE Lexan type 201-112 material. In addition, light emitting portions 66 may be formed a textured surface, meaning that it diffuses light. In one particular embodiment, all exterior surfaces of light pipes 30 are manufactured according to SPE/SPI Number 1. This is a standard surface finish callout for plastics that is machined into the production tool. In addition, light emitting regions 66, including portions 70 and 72 may be coated according to class B Cisco cosmetic spec 700474-0000, or Cisco Systems standard quality control spec for plastic products.

Thus, according to the teachings of the invention, by use of a plurality of light pipes, the status of operation of Ethernet switch 10 may be made known to a user located either in the direction of the bottom of Ethernet switch 10 or the front of Ethernet switch 10. Such an indication in a plurality of directions allows configuration during installation of Ethernet switch 10 such that it may rest on its bottom side or its front side, as described by the user.

Figure 3:
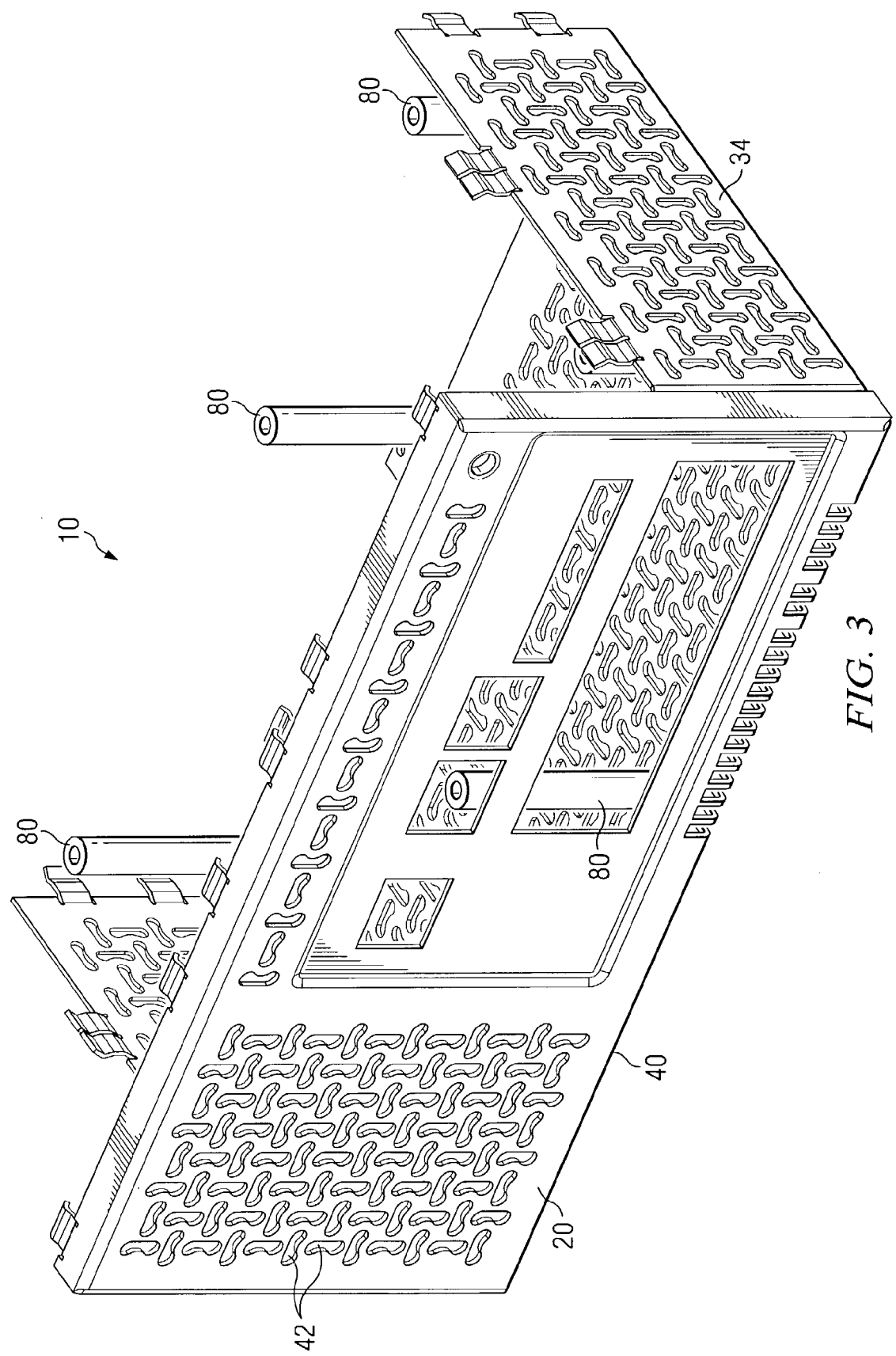
FIG. 3 is an isometric drawing of portions of the Ethernet switch of FIG. 1B, showing certain elements related to cooling of the Ethernet switch.

FIG. 3 is an isometric drawing showing portions of Ethernet switch 10 according to the teachings of the invention. In this view, portions of Ethernet switch 10 are deleted so as to render visible spacers 80. Spacers 80 are formed from a generally thermally conductive material, such as aluminum, and operate to both physically support internal cards that perform the main functions of the Ethernet switch as well, as thermally conduct heat from the cards to bottom 40 of the housing of Ethernet switch 10. Thus, heat that is generated by Ethernet switch and transferred to the cards, such as cards 50 or 82 (FIG. 4A) may be conducted to the housing of Ethernet switch 10 for dissipation to the atmosphere. This is one cooling approach utilized by the teachings of the invention. Other approaches are described in greater detail below in conjunction with FIGS. 4A through 5B.

As illustrated, the housing of Ethernet switch 10 is formed with a plurality of apertures 42. Apertures 42 are designed to maximize the surface area of the apertures along the housing of Ethernet switch 10 to allow for heat transfer to the outside atmosphere but at the same time meet electromagnetic emission requirements.

Figure 4A:
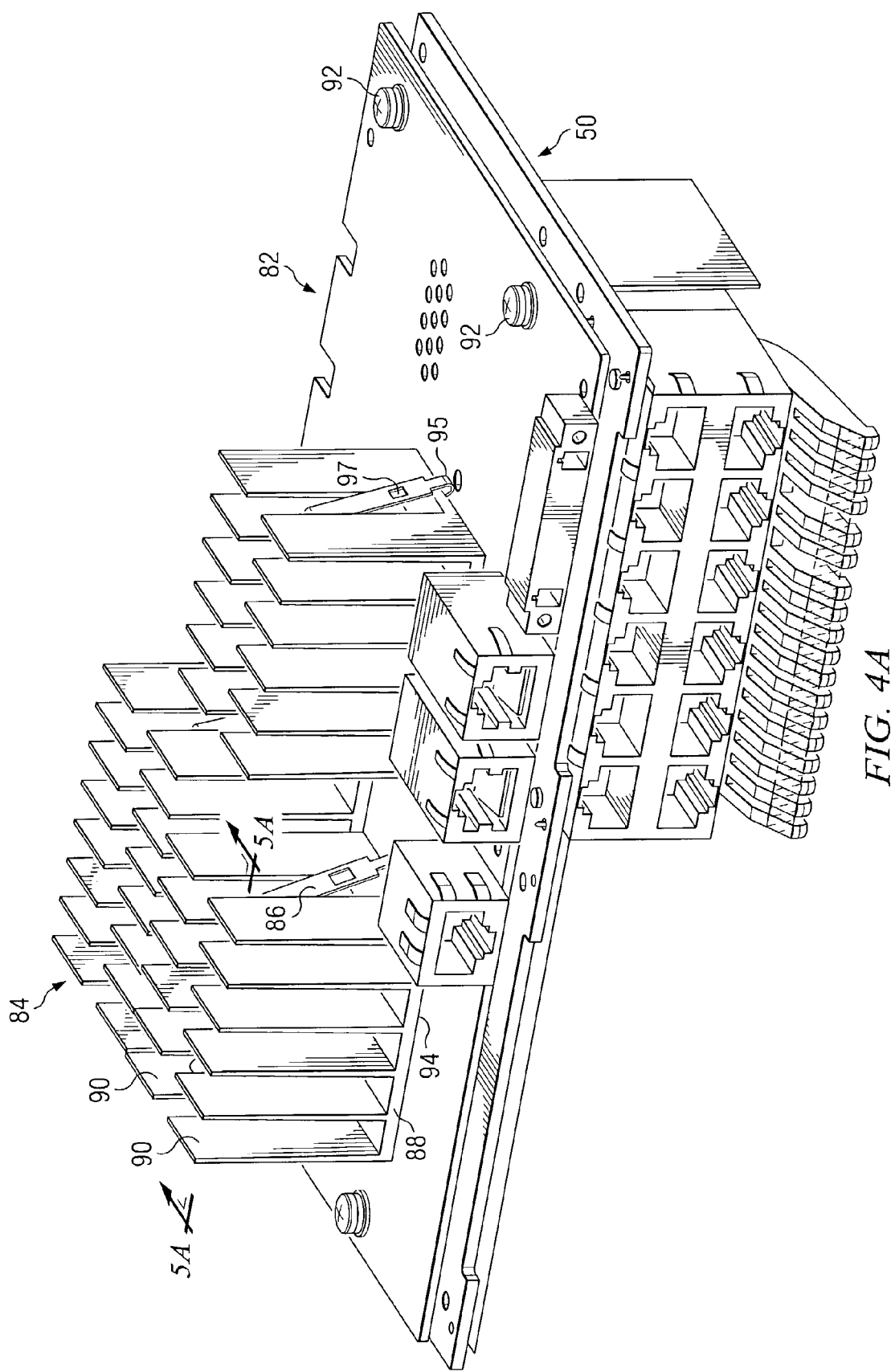
FIG. 4A is an isometric drawing showing two cards that are included within the Ethernet switch of FIG. 1B and associated cooling elements.

FIG. 4A is an isometric drawing showing cards 50 and 82 as they would appear positioned within housing of Ethernet switch 10. Card 50 is a PHY card, described above, which includes a plurality of ports and light pipes for indicating the status of the ports or other operations within Ethernet switch 10, as described above. Card 82 is a CPU with copper uplinks card and houses the CPU control, an ethernet switch and two alarm relays for external signaling. Disposed on both card 82 and card 50 (see FIG. 4D) are various cooling devices for dissipating heat generated by Ethernet switch 10. As described above, because of the environment in which industrial Ethernet switches are often utilized, passive cooling is required, and thus no convection fans are allowed. This restraint creates challenges for the designer in terms of heat dissipation.

Also illustrated in FIG. 4A are a plurality of heat sinks 84 disposed overlying card 82. Heat sinks 84 are coupled to card 82 through a plurality of elastic clips 86. Elastic clips 86 are shown best in FIG. 5A. Heat sinks 84 are formed with a base portion 88 and a fin portion 90. Disposed between base portion 88 and card 82 (or component on card 82) is a phase change material that changes from a solid to a fluid as it is heated. By changing from a solid to a fluid, voids between the contact of the base portion 88 of heat sinks 84 and card 82, or components overlying card 82, are filled creating a better path for the heat to be conducted across the component/heat sink interface. In one example, the thermal interface material is Thermagon HP105, which changes from solid to liquid phases at approximately 60-65 degrees C. However, other interface materials that change phase from solid to liquid may be used.

Figure 5A:
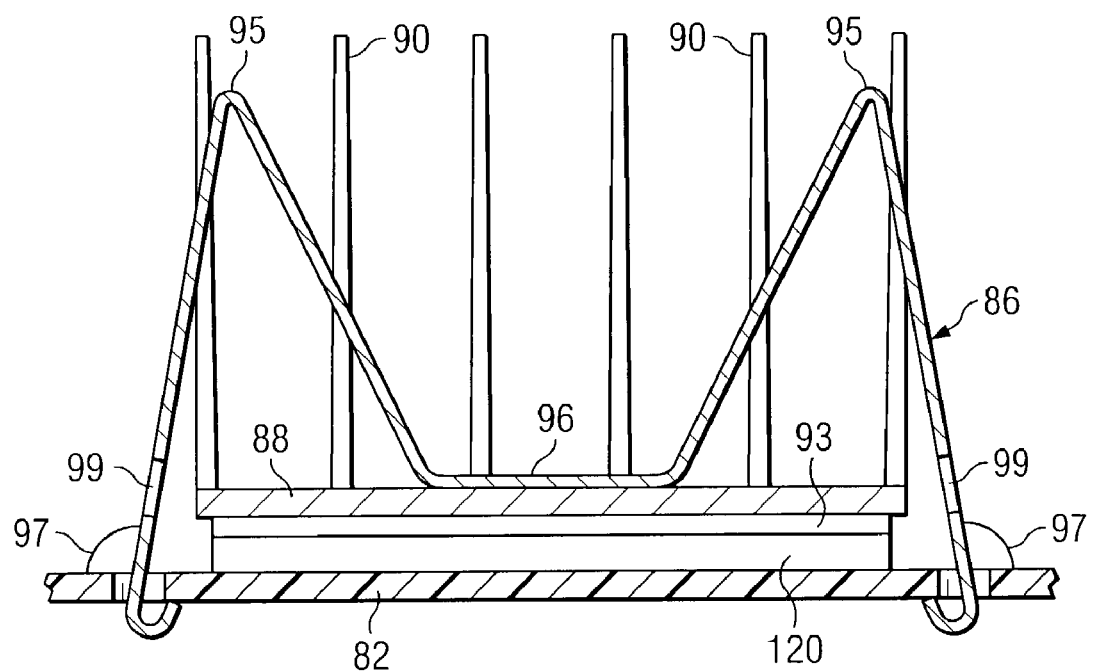
FIGS. 5A and 5B are elevated drawings showing details of clips used to secure heat sinks according to the teachings of the invention.

Elastic clips 86 operate to provide an elastic force on base 88 of heat sinks 84 (better illustrated in FIG. 5A). Clips 86 work in conjunction with the phase change material 94 to provide a more conductive path for heat to transfer from components on card 82 to the atmosphere. By providing an elastic force against base 88, clips 86 reduce any space created as the thermal interface material 94 goes through a phase change. Thus, a good thermal contact is maintained between components to be cooled and heat sinks 84. If a conventional fastener were used to connect heat sinks 84 to the components on card 82, the conventional fastener, such as screw, would not necessarily maintain good contact between heat sinks 84 and component overlying card 82 as the thermal interface material changes phase. This is because a pin would not provide sufficient pressure when interface material goes through a phase change.

According to one embodiment, heat sinks 84 are formed from a relatively lightweight material, such as aluminum. However, other materials may be used. The use of a lightweight material both allows better cooling, due to reduced thermal mass and therefore the reduced time to heat fins 90, as well as providing lower inertia, which produces desirable vibration characteristics. The lighter weight heat sinks 84 reach thermal equilibrium quicker than more robust sinks and hence radiate and transfer the heat from the component more rapidly. This maintains a cooler component.

In general, heat generated on a component under heat sinks 84 is conducted through phase change material 94 to base 88 of heat sinks 84. The heat then conducts to fins 90 where, in the illustrated orientation, the predominant heat transfer mechanism is radiation, and fins 90 radiate heat toward housing of Ethernet switch 10. When disposed in a vertical orientation, the predominant heat transfer mechanism is free convection, also known as a chimney effect, and heat transfer occurs through the slow movement of air over fins 90, taking the heat to the housing of Ethernet switch 10.

As described above, spacers 80 (FIG. 3) support cards 82 and 50 through fasteners 50 and also provide conduction directly from card 82 and 50 to the bottom 40 of Ethernet switch 10. This provides additional heat transfer directly from the cards to the housing of Ethernet switch 10.

Figure 4B:
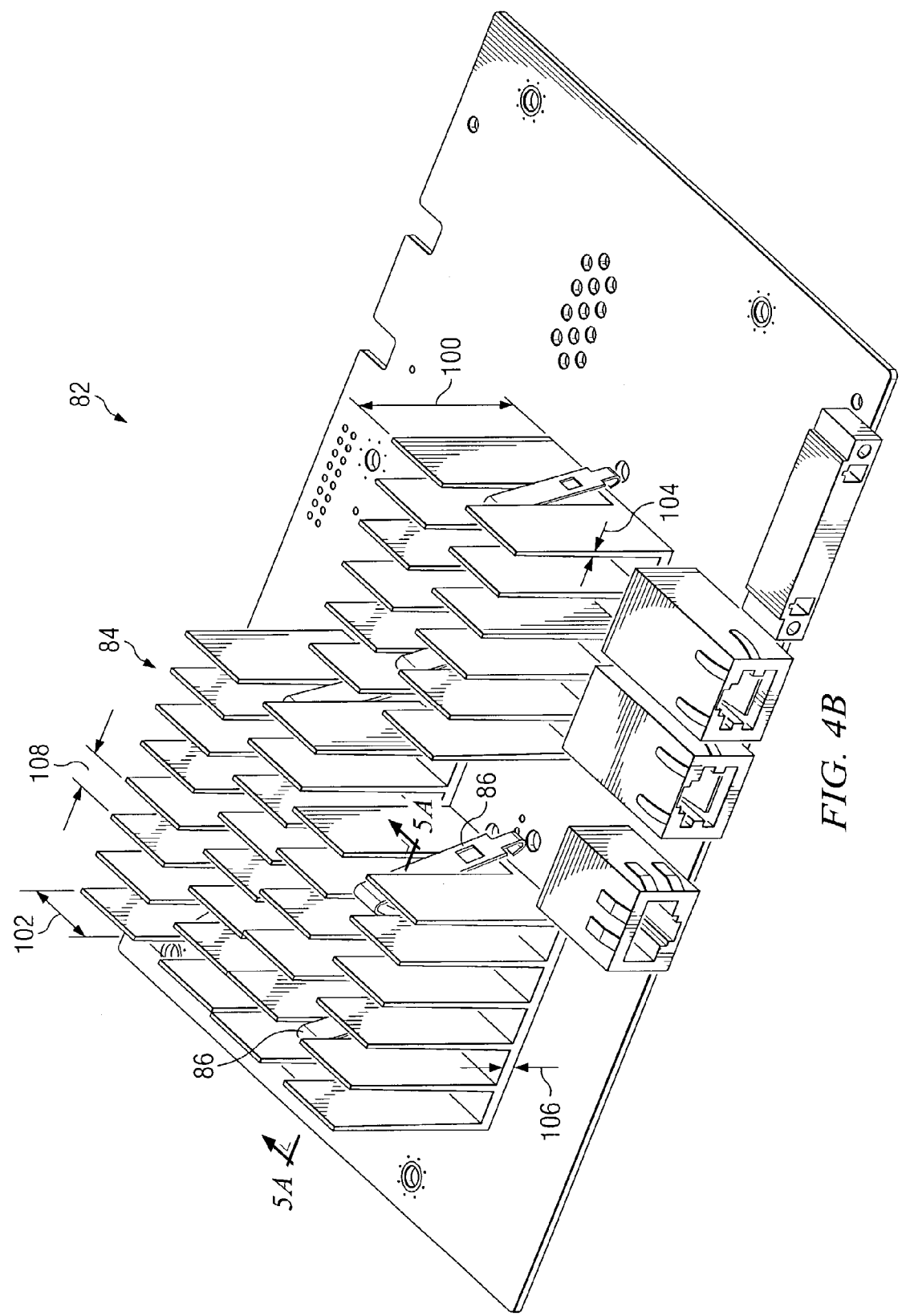
FIG. 4B is an isometric drawing showing a CPU with copper uplink card of FIG. 4A.
Figure 4C:
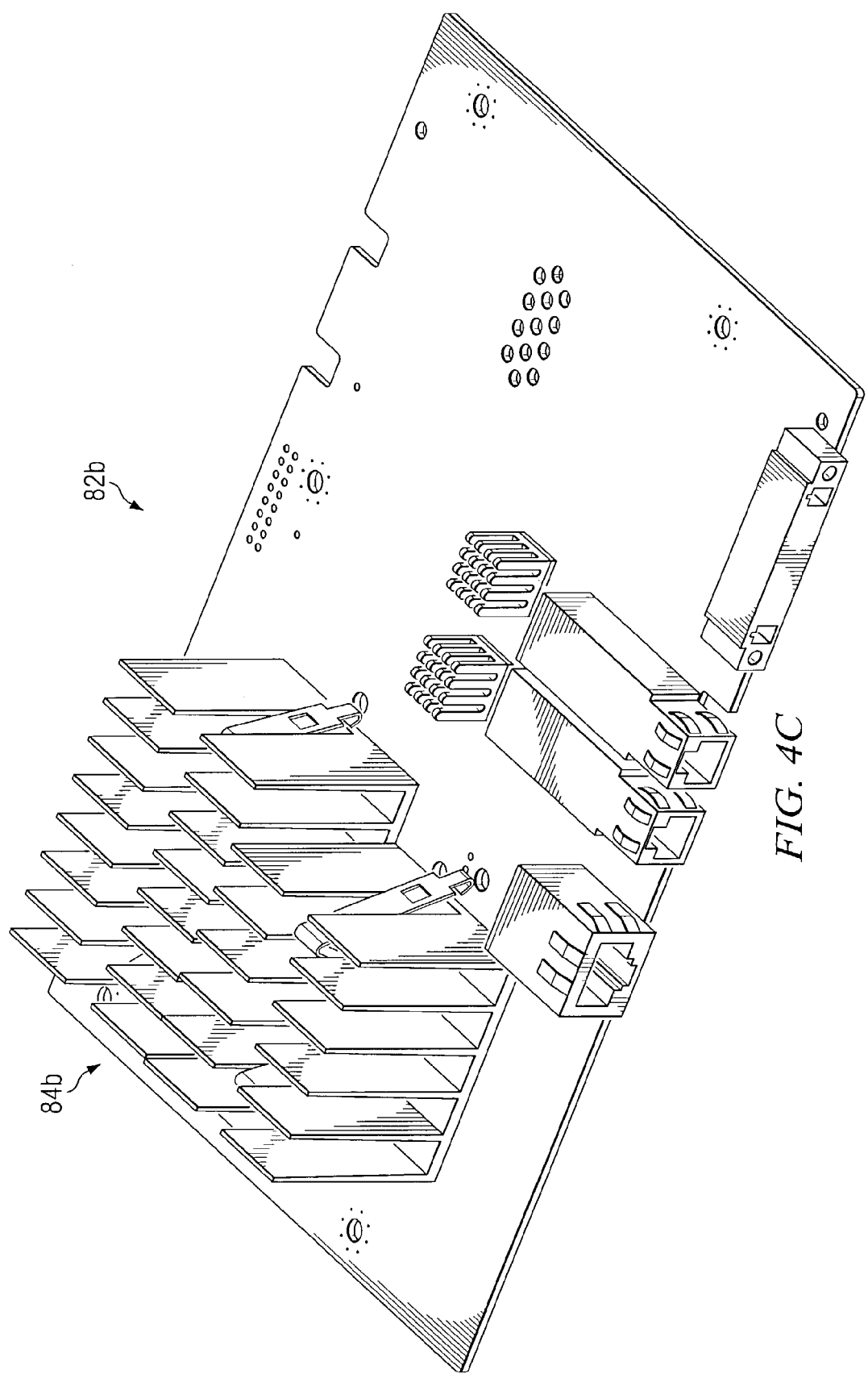
FIG. 4C is an isometric drawing showing an alternative embodiment of the CPU with copper uplink card of FIG. 4A.

FIG. 4B shows more clearly card 82. Although any suitable orientation of heat sinks 84 may be utilized, a particular configuration is described in detail below. In this configuration, each of the fins 90 of the heat sinks 84 has a height of approximately 1.4 inches, as indicated by reference numeral 100. Fins 84 also have an approximate width of 0.60 inches as indicated by reference numeral 102, and are formed with a thickness of approximately 0.03 inches, as indicated by reference numeral 104. Base 88 is formed with a thickness of approximately 0.9 inches, as indicated by reference numeral 106. The various fins within a given heat sink are spaced apart approximately 0.3 inches as indicated by reference numeral 108. As illustrated some of the heat sinks are formed in groups having six fins and some are formed in groups having eight fins; however, other configurations and numbers of fins may be utilized according to desired heat transfer requirements and card layout. FIG. 4C is an alternative embodiment of card 82. In this embodiment, a lesser number of fins is utilized to accommodate additional components on card 82b.

Figure 4D:
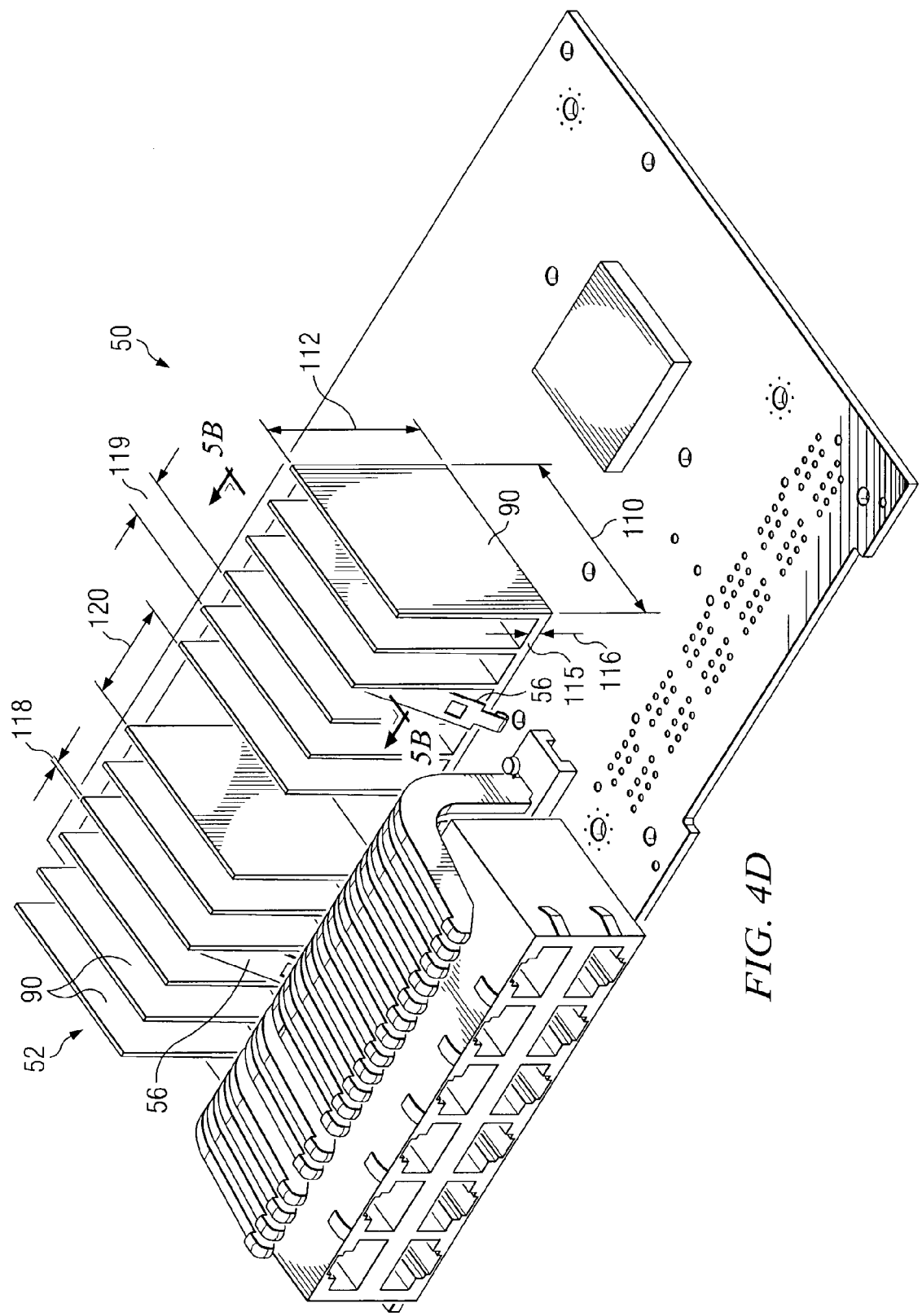
FIG. 4D is an isometric drawing showing the PHY card of FIG. 4A.

FIG. 4D shows a bottom view of card 50. As illustrated, card 50 includes a plurality of heat sinks 52 attached to card 50 via clips 56. Heat sinks 52 are substantially similar to heat sinks 84, except they are oriented differently and have different dimensions. In this particular embodiment, fins 90 have a length of 1.5 inches, as designed by reference numeral 110 and a height of 1.31 inches as designated by reference numeral 112. Fins 90 are formed with a thickness of 0.030 inches as designated by reference numeral 118 and base 115 is formed with a thickness of 0.090 inches as designated by reference numeral 116. In this embodiment, fins 90 are spaced apart by a distance of 0.304 inches, as designated by reference numeral 119 with an irregular spacing of 0.75 inches, as designated by reference numeral 120 to accommodate the board layout. In this embodiment, clip 56, which is substantially similar to clip 86, depresses against base 115 of heat sinks 52 between fins 90. This contrasts with card 82 in which clips 86 depress against base 88 between rows of fins 90.

In addition to the illustrated heat transfer mechanisms, thermal vias may be formed within cards 50 and 82 to further allow heat transfer within Ethernet switch 10.

Figure 5B:
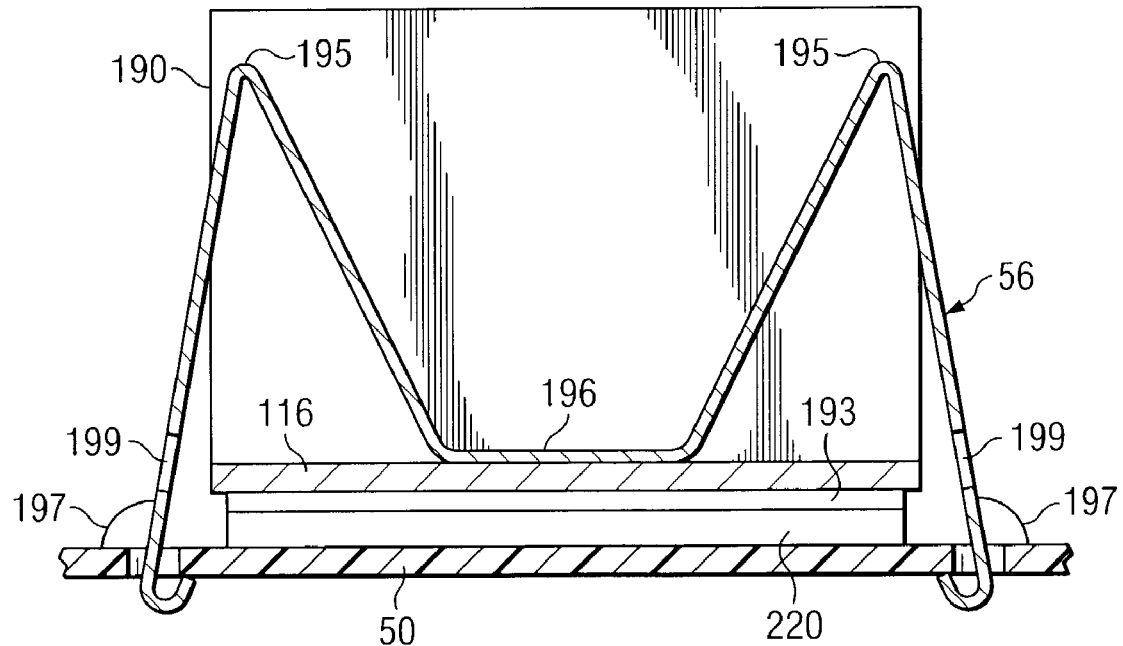

FIGS. 5A and 5B are partial elevational views of FIGS. 4B and 4D, respectively, along the indicated lines, showing clips 86 and 56. In FIG. 5A, clip 86 is illustrated as having a shape in the general configuration of an M with two side portions 95 and a middle portion 96. On the ends of side portions 95 are hooks 97 for coupling clip 86 to card 82. Clips 86 may also be formed with holes 99 for receiving a tool for attaching clips 86 to card 82. As illustrated, middle portion 96 overlies a base 88 of heat sinks 84. Below base 88 is a phase change material 93, described above, which fills voids between base 88 and a component 120 overlying card 82. Clip 56 of FIG. 5B is analogous to clip 86 except that it is disposed between two fins 90 of heat sinks 90, rather than a cut across the heat sink fins.

Although some embodiments of the present invention have been described in detail, it should be understood that various changes, substitutions, and alterations can be made thereto without departing from the spirit and scope of the invention as defined by the appended claims.

What is claimed is:

1. An Ethernet switch comprising:
   a housing having a front side and a bottom side adjacent the front side;

a plurality of ports associated with the housing and operable to receive and transmit Ethernet traffic;

a plurality of light generating devices each associated with respective ones of the ports, each light generating device operable to provide an indication of the status of the respective port; and a plurality of light pipes each associated with a respective one of the light generating devices and operable to display light generated by a respective one of the light generating devices such that the light is visible on the front side and on the bottom side of the housing, each light pipe operable to emit a first portion of light from the respective light generating device through a first light emitting surface that is deflected by an angled surface and emit a second portion of light from the respective light generating device through a second light emitting surface that is not deflected by the angled surface, the first light emitting surface being generally perpendicular to the second light emitting surface.

2. The Ethernet switch of claim 1, wherein each light emitting surface comprises an electric discharge machining textured surface or fine bead blast.

3. The Ethernet switch of claim 1, wherein the Ethernet switch further comprises:

at least one light generating device associated with a portion of the Ethernet switch other than a port; and an additional light pipe associated with the additional light generating device operable to display light generated by the additional light generating device such that the generated light is visible on the front side and the bottom side of the housing.

4. The Ethernet switch of claim 1, wherein the housing is formed with mounting clips on a side opposite the front side and on a side of the housing opposite the bottom side.

5. The Ethernet switch of claim 1, wherein each of the plurality of light pipes is further operable to display light generated by respective ones of the light generating devices such that the light is visible on an edge of the housing formed by the front side and the bottom side.

6. An apparatus comprising: a housing having a front side and a bottom side adjacent the front side; at least one heat sink disposed within the housing and overlying a component of the apparatus, the at least one heat sink having a base and a plurality of fins extending from the base; an elastic clip having a middle portion placing an elastic force on the base in order to couple the heat sink to the component with two end portions securing the clip in place; a plurality of light generating devices each operable to generate light in response to the operation of a particular component of the apparatus; and a plurality of light pipes each associated with a respective one of the light generating devices and operable to display light generated by the respective light generating device such that the light is visible on the front side and on the bottom side of the housing, each light pipe operable to emit a first portion of light from the respective light generating device through a first light emitting surface that is deflected by an angled surface and emit a second portion of light form the respective light generating device through a second light emitting surface that is not deflected by an angled surface, the first light emitting surface being generally perpendicular to the second light emitting surface.

7. The apparatus of claim 6, wherein each of the plurality of light generating devices is associated with respective ports of an Ethernet switch.

8. The apparatus of claim 6, wherein each of the light generating devices is associated with components of an Ethernet switch.

9. The Ethernet switch of claim 6, wherein each light emitting surface comprises an electric discharge machining textured surface or fine bead blast.

10. The Ethernet switch of claim 6, wherein the housing is formed with mounting clips on a side opposite the front side and on a side of the housing opposite the bottom side.

11. The Ethernet switch of claim 6, wherein each of the plurality of light pipes is further operable to display light generated by respective ones of the light generating devices such that the light is visible on an edge of the housing formed by the front side and the bottom side.

12. An Ethernet switch comprising:

an uplink card having a configuration port and at least one uplink port connected thereto;

at least one heat sink coupled to the uplink card, each heat sink having a base and a plurality of fins extending from the base away from the uplink card;

a phase change material disposed between the component on the uplink card and the base, the phase change material operable to change phases from a solid to a liquid at a temperature between 30° C. and 100° C.; an elastic clip having a middle portion placing an elastic force on the base in order to couple the at least one heat sink to the uplink card and also having two end portions connected to the uplink card;

a housing for containment and protection of the uplink card a light generating device operable to generate light in response to the operation of a particular component of the apparatus; and a light pipe associated with the light generating device and operable to display light generated by the light generating device such that light from the light generating device is visible on the front side and on the bottom side of the housing, the light pipe operable to emit a first portion of light from the light generating device through a first light emitting surface that is deflected by an angled surface and emit a second portion of light from the light generating device through a second light emitting surface that is not deflected by the angled surface, the first light emitting surface being generally perpendicular to the second light emitting surface.

13. The Ethernet switch of claim 12, and further comprising a PHY card coupled to the uplink card;

at least one heat sink coupled to the PHY card, each heat sink having a base and a plurality of fins extending from the base away from the PHY card;

a phase change material disposed between component on the PHY card and the base, the phase change material operable to change phases from a solid to a liquid at a temperature between 30° C. and 100° C.; and an elastic clip having a middle portion placing the elastic force on the base in order to couple the at least one heat sink to the PHY card via two end portions connected to the PHY card.

14. The Ethernet switch of claim 12, wherein the at least one heat sink comprises a plurality of aluminum fins.

15. The Ethernet switch of claim 12, wherein the elastic clip comprises an M-shaped clip.

16. The Ethernet switch of claim 12, wherein the elastic clip comprises a means for elastically coupling the base to the PHY card.

17. The Ethernet switch of claim 13 and further comprising a plurality of spacers coupling both the uplink card and the PHY card to the housing of the Ethernet switch.

18. An apparatus comprising:

a housing;

at least one heat sink disposed within the housing and overlying a component of the apparatus, the at least one heat sink having a base and a plurality of fins extending from the base;

an elastic clip having a middle portion placing an elastic force on the base in order to couple the heat sink to the component and two end portions securing the clip in place;

further comprising a phase change material disposed between the component and the base and operable to change phase from a solid phase to a liquid phase at a temperature between 30° C. and 100° C.;

a light generating device operable to generate light in response to the operation of a particular component of the apparatus; and a light pipe associated with the light generating device and operable to display light generated by the light generating device such that light from the light generating device is visible on the front side and on the bottom side of the housing, the light pipe operable to emit a first portion of light from the light generating device through a first light emitting surface that is deflected by an angled surface and emit a second portion of light from the light generating device through a second light emitting surface that is not deflected by the angled surface, the first light emitting surface being generally perpendicular to the second light emitting surface.

19. The apparatus of claim 18, further comprising:

at least one component card on which the component is disposed; and wherein the two end portions of the elastic clip secure the clip to the at least one component card.

20. The apparatus of claim 18, wherein the component is an electronic chip.

21. The apparatus of claim 18, wherein the housing is formed with a plurality of perforations for allowing heat to escape the housing.

22. The apparatus of claim 18, wherein the elastic clip is an M-shaped clip.

23. The apparatus of claim 18, wherein the elastic clip comprises a means for coupling the heat sink to the component.

* * * * *